United States Patent
Koning et al.

(10) Patent No.: US 7,036,573 B2
(45) Date of Patent: May 2, 2006

(54) POLYMER WITH SOLDER PRE-COATED FILLERS FOR THERMAL INTERFACE MATERIALS

(75) Inventors: Paul A. Koning, Chandler, AZ (US); Fay Hua, San Jose, CA (US); Carl L. Deppisch, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/071,471

(22) Filed: Feb. 8, 2002

(65) Prior Publication Data

US 2003/0150604 A1    Aug. 14, 2003

(51) Int. Cl.
*F28F 7/00* (2006.01)
*C08K 9/10* (2006.01)

(52) U.S. Cl. .................. 165/185; 165/905; 523/210
(58) Field of Classification Search ............. 165/185, 165/80.3, 905; 361/704, 705, 712; 428/147, 428/148; 257/772; 523/200, 210
See application file for complete search history.

(56) References Cited

U.S. PATENT DOCUMENTS

| | | | | |
|---|---|---|---|---|
| 4,606,962 A | * | 8/1986 | Reylek et al. | 428/148 |
| 4,612,601 A | * | 9/1986 | Watari | 361/705 |
| 4,869,954 A | * | 9/1989 | Squitieri | 442/13 |
| 4,914,551 A | * | 4/1990 | Anschel et al. | 361/714 |
| 5,062,896 A | * | 11/1991 | Huang et al. | 106/287.19 |
| 5,213,715 A | * | 5/1993 | Patterson et al. | 252/514 |
| 6,059,952 A | * | 5/2000 | Kang et al. | 205/143 |
| 6,114,413 A | * | 9/2000 | Kang et al. | 523/210 |
| 6,207,300 B1 | * | 3/2001 | Koch et al. | 428/680 |
| 6,340,113 B1 | * | 1/2002 | Avery et al. | 228/248.5 |
| 6,365,973 B1 | * | 4/2002 | Koning | 257/772 |

FOREIGN PATENT DOCUMENTS

| | | | |
|---|---|---|---|
| JP | 07179832 A | * | 7/1995 |
| JP | 02000309773 A | * | 11/2000 |
| WO | WO 02/11504 A2 | * | 2/2002 |

* cited by examiner

*Primary Examiner*—Tho Duong
(74) *Attorney, Agent, or Firm*—Blakely, Sokoloff, Taylor & Zafman LLP

(57) ABSTRACT

A thermal interface material made of a binder material and a fusible filler.

8 Claims, 5 Drawing Sheets

POLYMER WITH SOLDER PRE-COATED FILLERS FOR THERMAL INTERFACE MATERIALS

FIELD OF THE INVENTION

The present invention relates to the field of computer component assembly and in particular to a thermal interface material placed between the computer components.

BACKGROUND OF THE INVENTION

Today's semiconductors, whether discrete power or logic ICs, are smaller, run faster, do more and generate more heat. Some microprocessors dissipate power levels that were once the exclusive domain of discrete power devices, namely 10 to 25 watts. These power levels require thermal management techniques involving large capacity heat sinks, good airflow and careful management of thermal interface resistances. A well-designed thermal management program will keep operating temperatures within acceptable limits in order to optimize device performance and reliability.

Semiconductors are kept within their operating temperature limits by transferring junction generated waste heat to the ambient environment, usually the surrounding room air. This is best accomplished by attaching a heat sink to the semiconductor package surface thus increasing the heat transfer between the hot case and the cooling air. Once the correct heat sink has been selected, it must be carefully joined to the semiconductor package to ensure efficient heat transfer through this newly formed thermal interface. Thermal resistance is minimized by making the joint as thin as possible, increasing joint thermal conductivity by eliminating interstitial air and making certain that both surfaces are in intimate contact.

Attaching a heat sink to a semiconductor package requires that two solid surfaces be brought together into intimate contact. Unfortunately, no matter how well prepared, solid surfaces are never really flat or smooth enough to permit intimate contact since all surfaces have a certain roughness due to microscopic hills and valleys. As two such surfaces are brought together, only the hills of the surfaces come into physical contact. The valleys are separated and form air-filled gaps. When two typical electronic component surfaces are brought together, less than one percent of the surfaces make physical contact with as much as 99% of the surfaces separated by a layer of interstitial air. Some heat is conducted through the physical contact points, but much more has to transfer through the air gaps. Since air is a poor conductor of heat, it should be replaced by a more conductive material to increase the joint conductivity and thus improve heat flow across the thermal interface.

Several types of thermally conductive materials can be used to eliminate air gaps from a thermal interface, including greases, reactive compounds, elastomers and pressure sensitive adhesive films. All of these thermal interface materials (TIMs) are designed to conform to surface irregularities, thereby eliminating air voids and improving heat flow through the thermal interface.

Elastomers do not flow freely like the greases or compounds, but will deform if sufficient compressive load is applied to conform to surface irregularities. At low pressures, the elastomer cannot fill the voids between the surfaces and the thermal interface resistance is high. As pressure is increased, more of the microscopic voids are filled by the elastomer and the thermal resistance decreases. For most high durometer materials, mounting pressures around 300 to 500 psi eliminate the interstitial voids and reduce interface resistance to a minimum. Mounting pressure must be permanently maintained by using fasteners or springs to hold the two surfaces together.

Thermally conductive adhesive tapes are double-sided pressure sensitive adhesive films filled with sufficient ceramic powder to balance their thermal and adhesive properties. The adhesive tape is usually supported either with an aluminum foil or a polyimide film for strength and ease of handling. Polyimide support also provides electrical insulation. Adhesive tapes perform much like the elastomeric films, in that they also require some initial mating pressure to conform to irregularities in the mating surfaces. They are also unable to fill large gaps between non-flat surfaces. However, once the joint is formed, the adhesive tapes require no mechanical support to maintain the mechanical or thermal integrity of the interface.

Adhesive tapes provide convenience in attaching a heat sink to a semiconductor package because, unlike liquid adhesives, no cure time is required. The film is applied to one of the surfaces, usually to the heat sink, and it is then forced into contact with the semiconductor package to complete the thermal joint. The application pressure is typically 10 to 50 psi for a few seconds duration. The bond thus formed can be considered permanent and the heat sink is reliably attached to the semiconductor. However, this convenience comes at a price in that tapes are only slightly better at thermal conduction than a dry joint. This is because the thermal tapes do not fill gaps as well as liquids, and thermal joints made with tapes will normally include considerable interstitial air gaps. For the most part, the quality of the two joining surfaces will determine the amount of contact that can be achieved and the thermal performance that can be expected. The high shear strength of these thermal tapes means that reliable joints between heat sinks and semiconductors can be achieved, even with poor surfaces and no mechanical fasteners.

In summary, a variety of materials and approaches are available to manage or minimize the thermal resistance of semiconductor package-to-heat sink interfaces. Thermal greases and compounds will provide the lowest interface resistance, but they are pastes and require care in handling. Elastomers eliminate handling problems but they sometimes require high compressive loads even with well-prepared surfaces. Thermal tapes offer great convenience but their gap filling properties are limited. The success of any particular combination of heat sink, interface material and heat sink will depend on the thoroughness of the design, the quality of the interface material and its proper installation.

A TIM is typically made from a polymer matrix and a highly thermally conductive filler. TIMs find three application areas in a CPU package: 1) to bring a bare die package into contact with heat sink hardware (FIG. 1A), 2) to bring the die into good thermal contact with an integrated heat spreader (FIG. 1B), and 3) to bring the integrated heat spreader (heat spreader) into contact with OEM applied hardware (FIG. 1B). The TIM between the die (or die package) and heat spreader is called a TIM 1 and the TIM between the heat spreader and heat sink hardware is called a TIM 2.

FIG. 2 is an illustration of an arrangement of a non-fusible particle filler material within the polymer matrix of a TIM. The polymer matrix may be a material that can be applied as a paste such as a dispensable syringe or by screen printing. The polymer matrix may also act as an adhesive to bond the two mating parts together. The non-fusible particles, such as most metals, benefit from a high thermal conductivity, however a thermal flow path through the TIM is limited by the point-to-point contact of the particles as shown by the arrows. Non-fusible particles refer to particles that will not melt and flow during packaging assembly process, reliability testing, and product operation and so remain as point contacts with each other. Fusible materials can be defined as materials such as solder-like materials that melt below approximately 300° C. Non-fusible materials will melt well above 300° C., such as aluminum at 660° C., silver at 961° C., copper at 1084° C., gold at 1064° C., etc. Thermal conductivity through these non-fusible particles within the TIM, are limited to percolation and as a result, a thermal bottleneck through the non-fusible particles will be these small or point contacts between the particles.

The phenomenon of percolation describes the effects of interconnections present in a random system, here the number of filler particles that are randomly in point contact with each other to allow thermal conduction. Normally, to improve conduction limited by percolation, the amount of filler could be increased until a threshold amount is reached and heat conduction due to the filler, transitions to a sufficiently high value. Another problem is that for some metal particles in contact with some polymer binders, the bare particle filler can poison the polymer cure such as by hindering or blocking the curing agent.

DETAILED DESCRIPTION OF THE INVENTION

Figure 1A:
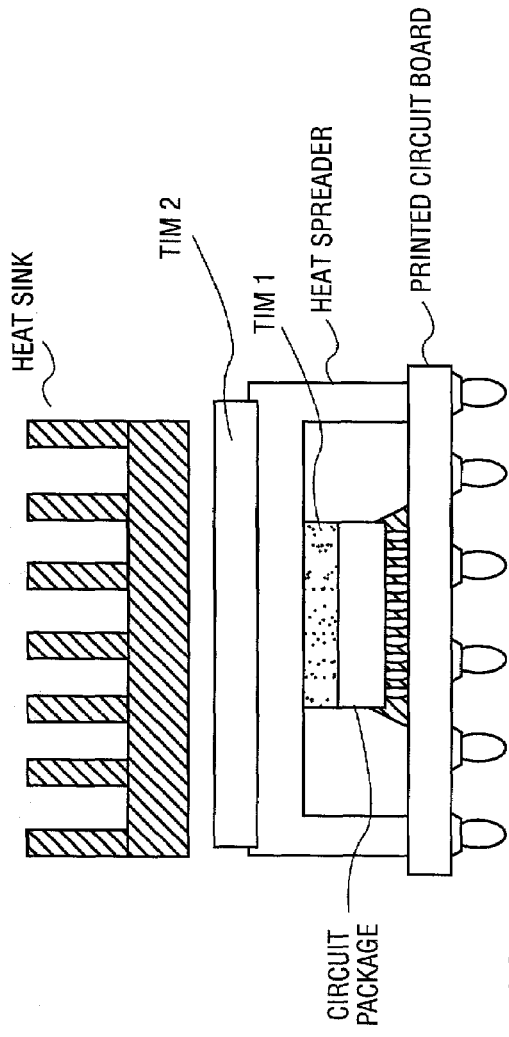
FIG. 1A is an illustration of an expanded view of a heat sink, a TIM 2, a heat spreader, a TIM 1, a circuit package, and a printed circuit board.
Figure 1B:
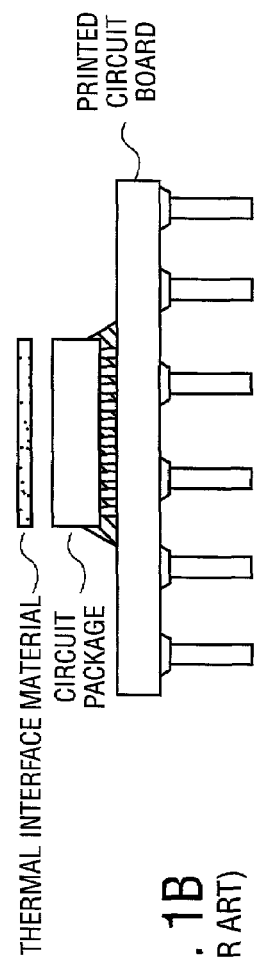
FIG. 1B is an illustration of an expanded view of a heat sink, a TIM, a circuit package, and a printed circuit board.
Figure 2:
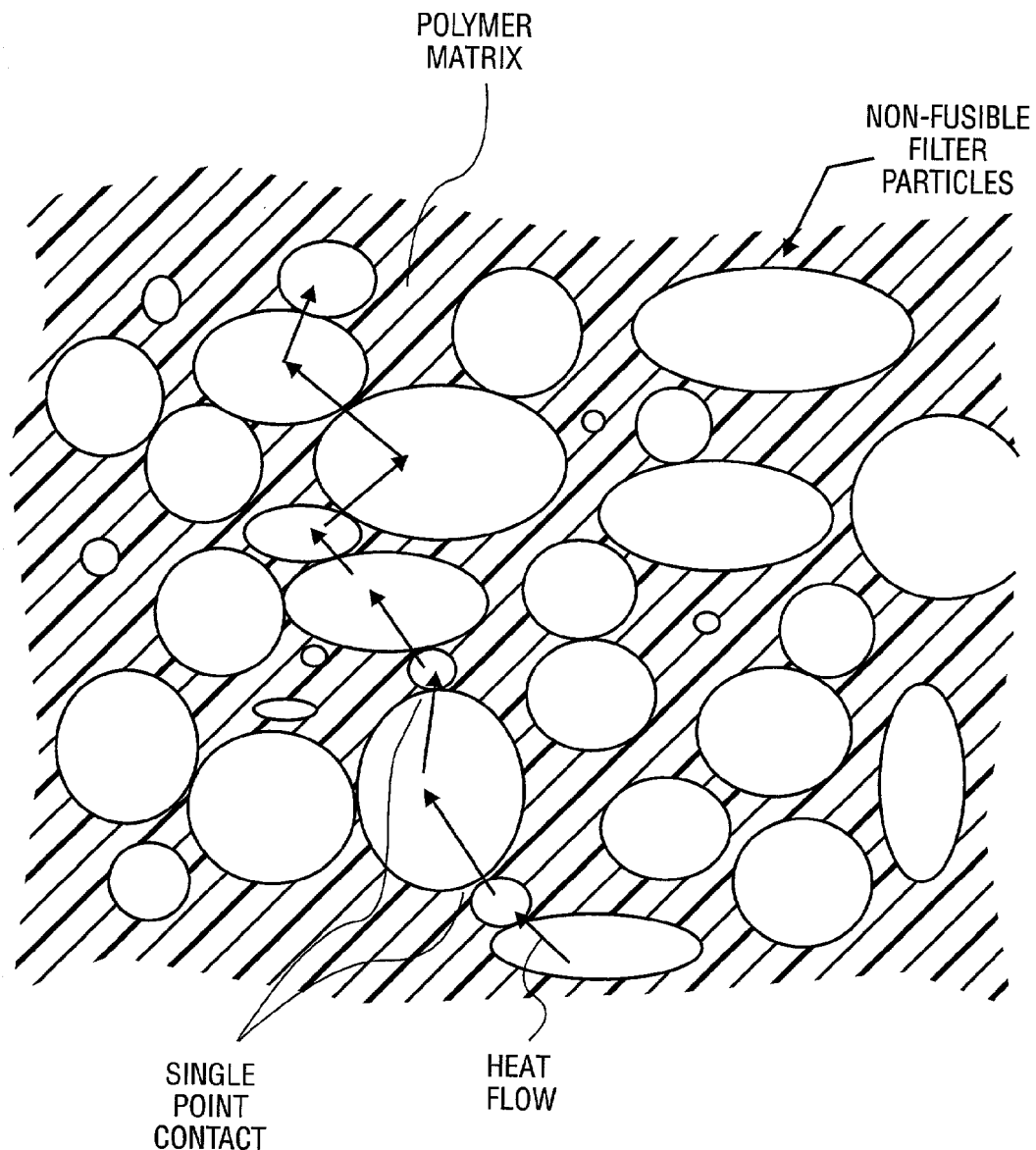
FIG. 2 is an illustration of an arrangement of a non-fusible particle filler material within the polymer matrix of a TIM.

A novel structure for a thermal interface material (TIM) having filler material to provide improved thermal conductivity is disclosed. The filler can be a blend of fusible materials, which will melt and flow during normal processing and non-fusible materials, which will not melt and flow during normal processing and so remain as point contacts with each other. The non-fusible filler can provide the highest thermal conductivity of the TIM ingredients, the fusible filler material can flow and connect adjacent non-fusible particles thereby improving bridging between the non-fusible particles and increasing pathways for thermal flow through the TIM. A polymer binder can contain the filler materials and provide a conformal medium between the mating surfaces. In one embodiment, the non-fusible materials are placed into the binder as small particles such as a powder, where each non-fusible particle can be pre-coated with a fusible material prior to mixing into a polymer binder.

A TIM having the filler material disclosed can improve thermal conductivity between mating components such as, for example, computer components. Such computer components can be a die attached to a heat sink or a spreader plate. Heat sink apparatus can be, for example, a heatpipe, cooled heat sinks, vapor chambers, liquid cooled thermal plates, refrigerated plates, thermoelectric modules, etc. In the following description numerous specific details are set forth such as specific materials, equipment, and processes in order to provide a thorough understanding of the present invention. In other instances, well known computer assembly techniques and machinery have not been set forth in detail in order to minimize obscuring the present invention.

Upon assembly, flow of the thermal interface material fills the cavities on the mating surfaces and therefore provides a low thermal resistance at this junction between the computer component and the TIM. There are many polymer binders with numerous additives to lower this thermal resistance. Thermal interface materials are applied in different thicknesses where the thickness variations can have more to do with the flatness issue then the cavities. Some of the thermal interface material types are designed to flow easier when applied to provide a thinner end result and therefore a lower thermal resistance. A compromise is to allow easy flow when applying the TIM while keeping the components in place using surface tension.

One form of heat sink is a heatpipe which is a heat transfer structure that can include a number of channels for transferring heat to a condenser region. The heatpipe can be composed of a central vapor channel with a number of parallel capillary channels, each of which is open on one side to the vapor channel thereby serving as the wick of the heat pipe, running the length of the heatpipe to a condenser region. The heat from the microchip vaporizes a working fluid in the capillaries and the vapor in turn travels in the vapor channel to a condenser region to be cooled and condensed by a cooling medium, such as air, present over this region.

When a heat sink is used, a contact surface on the heat sink can have a cross-section smaller than the circuit package it contacts and a portion of the circuit package may extend out beyond the heat sink edges. As a result, heat transfer may not be as efficient as required and a thermal adaptor such as a spreader plate may be needed. To improve thermal conduction between the heat sink and the circuit package, the spreader plate has a surface area and shape that can more closely match with the circuit package and where the spreader plate is positioned between the heat sink and the circuit package.

Figure 3:
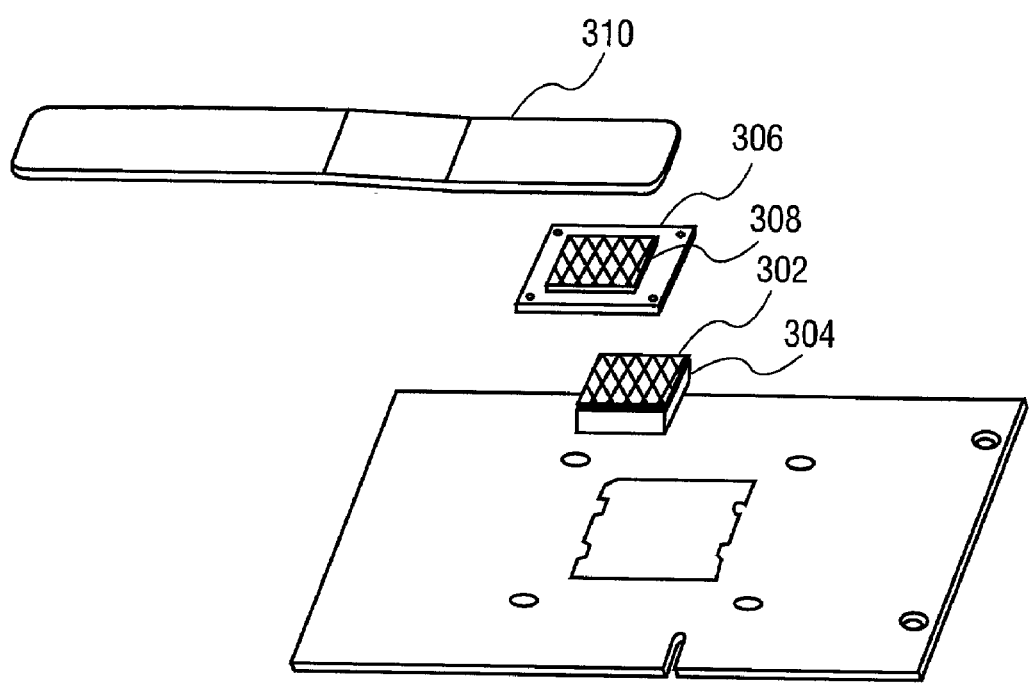
FIG. 3 is an illustration of an exploded view of thermal interface materials placed between computer components.

FIG. 3 is an illustration of an exploded view of thermal interface materials placed between computer components. In one embodiment, a first TIM (TIM 1) 302 can thermally connect the circuit package 304 to the spreader plate and a second TIM (TIM 2) 306 can thermally connect the spreader plate 308 to a heatpipe 310. A TIM 1 and/or a TIM 2 can have a polymer binder containing mixed filler (fusible+non-fusible filler) where during a reflow operation, a fusible material such as a solder, in contact with one or more non-fusible particles, can flow to increase the cross-sectional areas connecting non-fusible particle. The flow of the fusible filler can occur during a cure of the TIM polymer. It may be that a TIM can be applied using an uncured polymer binder that is later cured when in contact with mating components and this curing temperature may also serve to flow the fusible material. Alternatively, the polymer binder may be pre-cured, partially pre-cured, or require no elevated temperature for cure such that any temperature increase required to complete the cure may not be high enough to flow the fusible material and as such a later reflow operation that does flow the fusible material would be necessary. For purposes of this application, the term "reflow" refers to a process that heats the TIM causing the fusible material to flow within when the TIM is in a position between the mating components. As such, this reflow operation is regardless of whether or not the polymer is also being cured at the same time.

In one embodiment, the TIM can contain a filler that is solder coated non-fusible particles placed in a polymer binder. In this embodiment, the non-fusible particles can be a powder and where the non-fusible particles can be pre-coated with the solder prior to their addition to the polymer binder. Upon a reflow operation, the solder can wet out, coalesce and generally fuse non-fusible particles together. The advantage is that these coated particle fillers can have a much higher thermal conductivity than a normal solder filler (approx 420 W/mK for silver vs. 25–80 W/mK for solder) and higher thermal conductivity through the non-fusible particles due to improved pathways relative to the point contacts of the non-fusible particles-only filler. The result being the thermal conductivity of the TIM system is improved. The particles can be made from such highly conductive materials as metals, ceramic fibers, graphite fibers, carbon fibers, diamonds, and boron nitride. A partial list of the non-fusible metals that can be used as particles are, for example, copper (Cu), silver (Ag), gold, (Au), and aluminum (Al). A partial list of non-fusible non-metals that can be used as particles are, for example, boron nitride, aluminum nitride, graphite, diamond, carbon nanotubes, and silicon carbide or other carbon fibers. A partial list of non-fusible metal filler materials are, for example, aluminum and silver, or metal oxides such as, for example, aluminum oxides and zinc oxide, and metal coated fillers such as, for example, fusible metal coated carbon fiber or metal coated diamond. Solder coating over substantially the entire surface of the non-fusible particles can be accomplished in a variety of methods such as, for example, by electroless plating, sputtering or spraying on a fluidized bed, or by hydrometallurgical deposition. Alternative to a coating, the highly conductive non-fusible particles can be mixed with powdered solder and the mix then blended into the polymer binder.

The total weight of all filler relative in the weight of the TIM can be in the range of approximately 10–95% weight filler. The total weight of fusible filler can be in the range of approximately 60–90% by weight of the total weight of the TIM. The total weight of non-fusible filler can be in the range of approximately 5–49% by weight of the total weight of the TIM. With regards to the filler only, the volume percent of fusible filler to non-fusible filler can be in a range of approximately 5–95 volume % fusible filler. The preferred range can be approximately 10–50 volume % fusible filler. A mean particle diameter for the non-fusible particle can be approximately 25 microns.

Figures 4A, 4B:
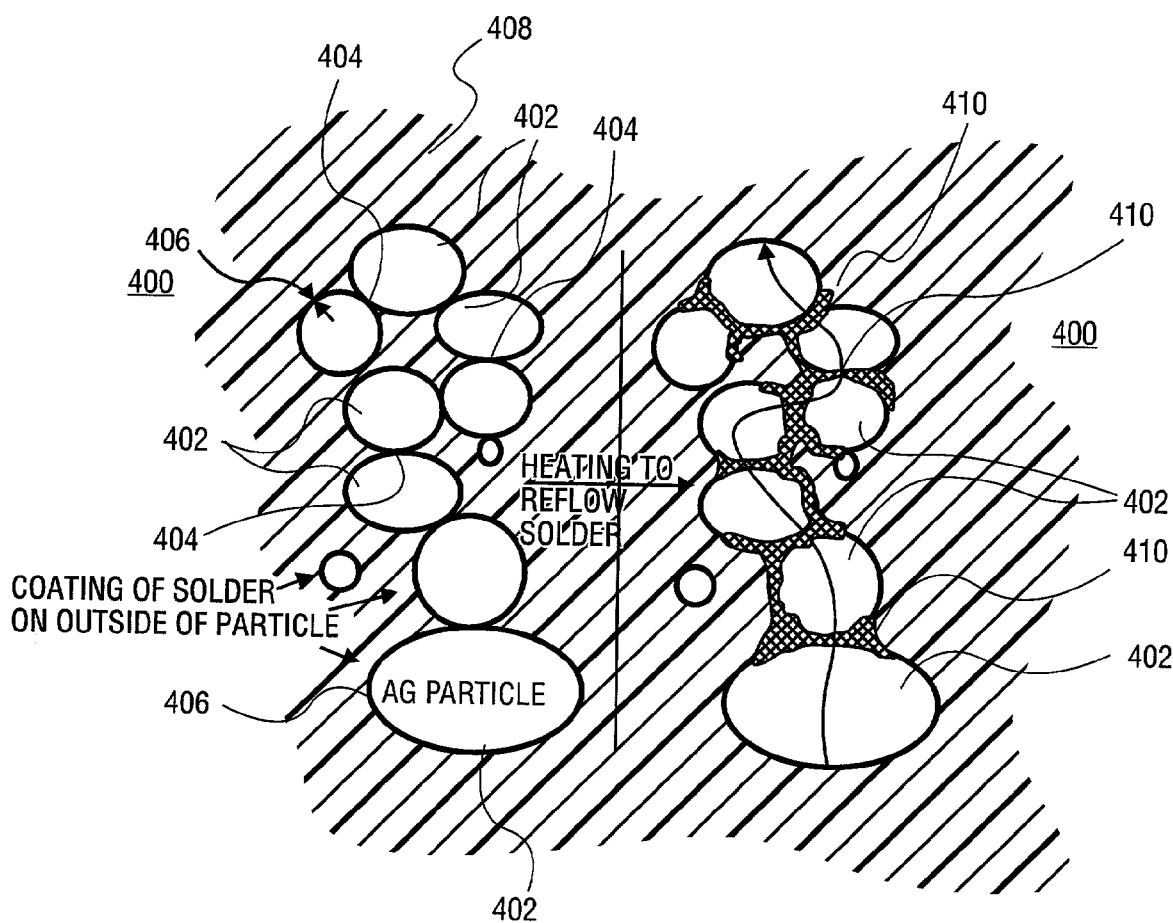
FIG. 4A is an illustration of one embodiment of solder coated particle filler before reflow.
FIG. 4B is an illustration of one embodiment of solder coated particle filler after reflow.

FIGS. 4A & 4B illustrate one embodiment of solder coated non-fusible particle filler before and after reflow respectively. As shown in FIG. 4A, the present invention coats the highly thermally conductive non-fusible particles (particles) 402 with the good but less thermally conductive solder or solder alloy 406 prior to blending with the plastic binder (cross-hatch) 408. The coated non-fusible particles 402 and 406 can initially be in point contact 404 with each other. As shown in FIG 4A, the coated non-fusible particles 402 and 406 are of non-uniform size and randomly positioned with respect to the plastic binder 408. As shown in FIG. 4B, larger contact areas 410 can be formed by the solder between the particles 402 resulting from the reflow operation. The larger contact areas 410 can be larger cross-sections of continuous pathways for heat conduction. In addition, the solder contact area 410 with the particle 402 can be wetted out providing good physical contact that results in good thermal transfer across this contact area 410. With solder coated particle filler 402 and 406, the amount of filler needed to obtain an equal value of thermal conductivity for the TIM 408 is much lower than using only solder filler 406 or particle filler 402.

A result of the present invention is to take advantage of both formula approaches, benefiting from solder flow that reduces percolation effects by producing larger continuous pathways (connecting particles) for improved heat flow combined with the higher conductivity of the non-fusible particles. This fusible filler with non-fusible filler mix can produce a TIM having a higher heat conductivity than either a solder filled TIM or a non-fusible particle filled TIM for a given amount of filler by percent weight. Another advantage of using the pre-coated non-fusible particle filler is that the solder coating acts as a barrier to the non-fusible metal and any potential for non-fusible metal interference with a polymer cure is avoided. Such a case could be with the use of a silver particle filler mixed within a one-part silicone cure polymer, where bare silver can poison the cure catalyst. A further advantage is that by using selection criteria, solders can be chosen that meet environmental toxicity concerns while still providing required physical/mechanical properties and good thermal performance for the TIM.

Almost any non-fusible particle filler can be coated with a solder, the coated filler then blended into a polymer matrix and used as a thermal interface material. However, solders that meet certain physical property and toxicity criteria make superior products in terms of robustness, reliability, and environmental safety issues. The key elements for selection of solders and solder alloys that meet these criteria can be:

1. To include solders and solder alloys that have a solidus temperature above 100° C., with above 130° C. preferred and therefore are not melting during reliability testing such as a 130°, 85% RH (relative humidity) HAST exposure. The HAST (highly accelerated stress testing) test maintains a product at a temperature and moisture level until failure or a particular degradation occurs.
2. To exclude solder and solder alloys containing metals that are inherently unstable to oxygen and/or water during the 130° C., 85% RH HAST exposure.
3. To exclude solder and solder alloys that contain environmentally toxic (such as when discarded into a landfill) heavy metals, particularly: lead, cadmium, mercury, antimony, and arsenic.
4. To exclude solder and solder alloys that have solidus temperatures above 250° C., since many polymers can begin to outgas above this temperature.
5. To include solder and solder alloys that provides good wetting to the heat spreader or heatpipe, to the die, to the packaging material, and to itself.

It has been found that indium (In) and tin (Sn) based solders, with minor additions of other elements, perform best for this application (i.e. formulating a TIM). Examples of solder alloys, which meet these selection rules include, but are not limited to, those listed below in Table 1.

TABLE 1

Acceptable TIM Solders/Solder Alloys

In/Sn, all mixtures
In/1–20 wt % silver (Ag)
Sn/0.7–1.4 wt % copper (Cu)
Sn/1–5 wt % Ag
Sn 42–85 wt %/58–15 wt % Bi
Sn/3.0–4.0 wt % Ag/0–1.7 wt % Cu
Sn/3–4 wt % Ag/1–6 wt % Bi
Sn/1 wt % Ag/57 wt % Bi In an alternate embodiment for a TIM, a polymer matrix can be filled with a fusible material only. The fusible filler material can be finely ground such as to a powder. The fusible filler material, such as a solder, can be added to the polymer binder until it constitutes approximately in the range of 60–95 weight %. The TIM using fusible solder and the polymer matrix can be placed between components to be thermally mated and the assembly of components and TIM then run through a reflow operation that converts the fusible solder to a liquid. Upon cooling, the fusible solder can solidify into column shapes that can improve thermal conductivity. The selection criteria for the solder filler can be those mentioned above and can include solder and solder alloys listed in Table 1.

Figures 5A, 5B:
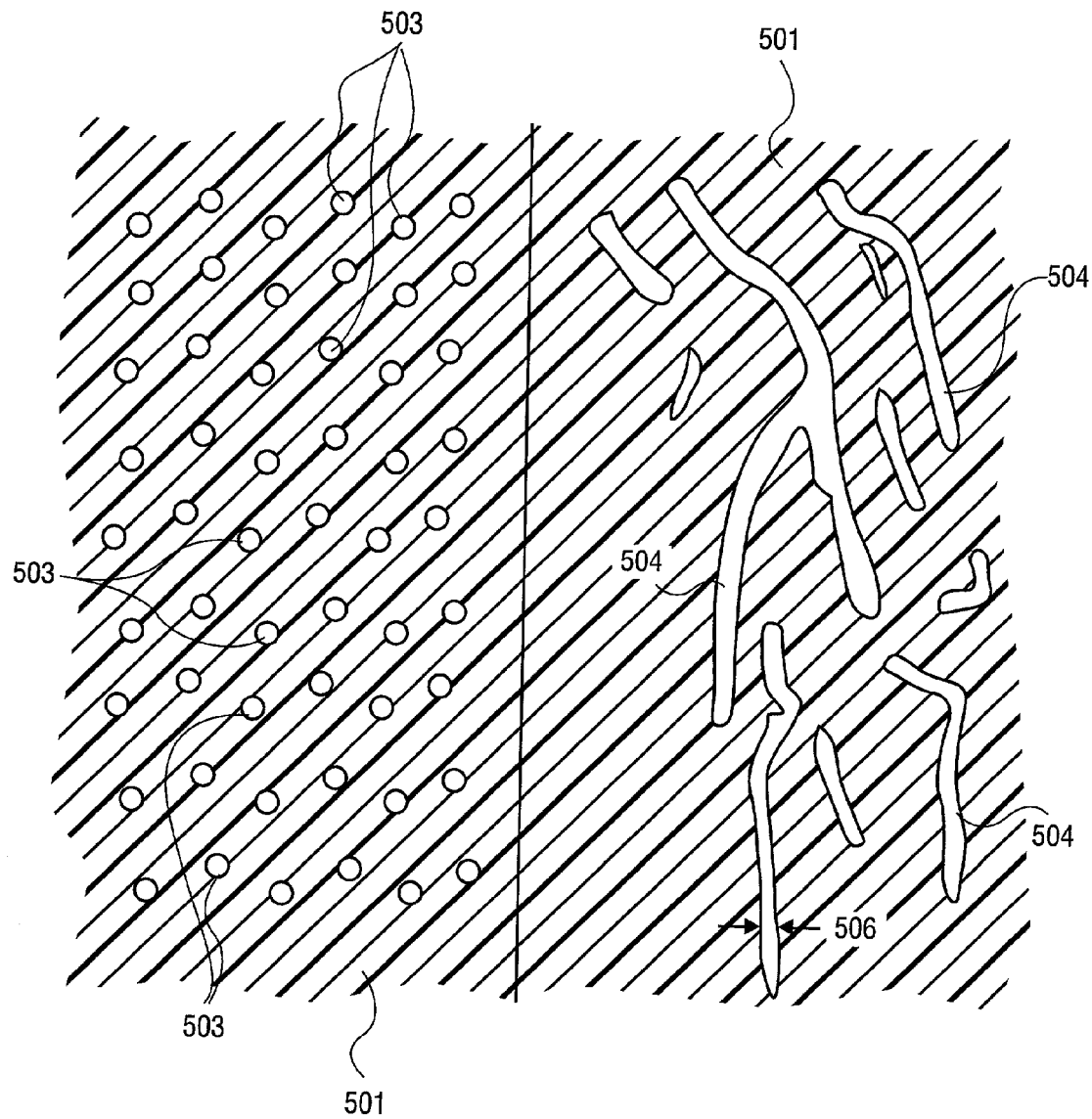
FIG. 5A is an illustration of a TIM having fusible filler in a polymer matrix prior to a reflow operation.
FIG. 5B is an illustration of a TIM having fusible filler in a polymer matrix after a reflow operation

FIGS. 5A & 5B are illustrations of a TIM having fusible filler in a polymer matrix after a reflow operation. Prior to a reflow operation, fusible filler, such as solder can exist in the polymer matrix as a finely ground powder 503. The polymer matrix 501 may require an elevated cure, which may also function as a reflow operation. If not, a reflow operation may be required, during which time the fusible filler 503 liquefies and can flow. A result of this liquefaction is the generally fusing together into strands of columnar structures 504 creating in the process larger cross-sections 506 of continuous pathways for heat conduction. A result of fusible filler 504 flow and the increased cross-sectional areas 506 is that higher thermal conductivity can be created through the larger pathways. The times and temperatures for the reflow operation can vary depending on the type and amount of filler and polymer binder used. The temperature range for a reflow operation can be in the range of approximately 150–400 degrees F. Once liquid, the fusible solder can form columnar shapes that provide thermal conductive paths, which will increase the overall thermal conductivity of the TIM.

What is claimed is:

1. A thermal interface material, comprising:
    a binder material; and
    a fusible filler within the binder material, the fusible filler randomly positioned with respect to the binder material, wherein the fusible filler is selected from the group consisting of an indium alloy that includes silver in an approximate range of 1 to 20 percent by weight, a tin alloy that includes copper in an approximate range of 0.7 to 1.4 percent by weight, a tin alloy that includes silver in an approximate range of 1 to 5 percent by weight, a tin alloy that includes tin in an approximate range of 42 to 85 percent by weight and bismuth in an approximate range of 15 to 58 percent by weight, a tin alloy that includes silver in an approximate range of 3.0 to 4.0 percent by weight and copper in an approximate range of 0 to 1.7 percent by weight, a tin alloy that includes silver in an approximate range of 3 to 4 percent by weight and bismuth in an approximate range of 1 to 6 percent by weight, and a tin alloy that includes silver approximately 1 percent by weight and bismuth approximately 57 percent by weight;
    a plurality of non-fusible particles having a mean diameter of approximately 25 microns, within the binder material, the non-fusible particles randomly positioned with respect to the binder material, the fusible filler coated onto the non-fusible particles wherein a volume percent of the fusible filler to non-fusible particles is in a range of approximately 10–50 percent by volume of fusible filler, wherein the non-fusible particles are selected from the group consisting of ceramic fiber, graphite fibers, carbon fibers, aluminum oxides, zinc oxide, graphite, carbon nanotubes, and silicon carbide.

2. The thermal interface material of claim 1, wherein the binder material is a polymer.

3. The thermal interface material of claim 1, wherein the binder material acts as an adhesive.

4. The thermal interface material of claim 1, wherein the fusible filler is a solder alloy having a solidus temperature above 100° C.

5. The thermal interface material of claim 1, wherein the fusible filler is 60–95% by weight of the total weight of the thermal interface material.

6. The thermal interface material of claim 1, wherein the fusible filler has a melting temperature of approximately between 100–250° C.

7. The thermal interface material of claim 1, wherein the fusible filler is stable to oxygen at temperatures up to approximately 150° C. and relative humidity up to approximately 90%.

8. The thermal interface material of claim 4, wherein the solder alloy has a solidus temperature below 250° C.

* * * * *